US012812854B2

(12) United States Patent
Zhang et al.

(10) Patent No.: US 12,812,854 B2
(45) Date of Patent: Nov. 24, 2026

(54) SEMICONDUCTOR DEVICE WITH A SHORTER STI IN A LOW-VOLTAGE REGION THAN IN A HIGH-VOLTAGE REGION

(71) Applicant: YANGTZE MEMORY TECHNOLOGIES CO., LTD., Wuhan (CN)

(72) Inventors: Quan Zhang, Wuhan (CN); Lan Yao, Wuhan (CN); Lu Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 754 days.

(21) Appl. No.: 17/892,873

(22) Filed: Aug. 22, 2022

(65) Prior Publication Data

US 2023/0062058 A1 Mar. 2, 2023

Related U.S. Application Data

(63) Continuation of application No. PCT/CN2021/115853, filed on Aug. 31, 2021.

(51) Int. Cl.

*H01L 27/11531* (2017.01)
*H01L 27/11573* (2017.01)
*H10B 41/42* (2023.01)
*H10B 43/40* (2023.01)

(52) U.S. Cl.

CPC ............. *H10B 41/42* (2023.02); *H10B 43/40* (2023.02)

(58) Field of Classification Search

CPC ...................................................... H10B 41/42
See application file for complete search history.

(56) References Cited

U.S. PATENT DOCUMENTS

| | | | | |
|---|---|---|---|---|
| 2002/0047170 A1* | 4/2002 | Ota | H10D 84/038 257/411 |
| 2007/0138545 A1 | 6/2007 | Lin et al. | |
| 2008/0035962 A1 | 2/2008 | Kim et al. | |
| 2013/0134520 A1* | 5/2013 | Maeda | H10D 84/0144 257/E27.06 |
| 2018/0102408 A1* | 4/2018 | Hsiung | H10D 62/115 |
| 2022/0302114 A1* | 9/2022 | Chuang | H10D 64/021 |
| 2024/0170335 A1* | 5/2024 | Fujita | B28D 5/0011 |

FOREIGN PATENT DOCUMENTS

| | | | |
|---|---|---|---|
| CN | 103000518 A | 3/2013 | |
| CN | 103137621 A | 6/2013 | |
| CN | 113097138 A * | 7/2021 | H10D 64/512 |
| CN | 114883269 A * | 8/2022 | H10D 84/0188 |
| KR | 20070070457 A | 7/2007 | |

* cited by examiner

*Primary Examiner* — Peter Bradford
(74) *Attorney, Agent, or Firm* — BAYES PLLC

(57) ABSTRACT

The disclosure provides a semiconductor device and a method for fabricating the same, a three-dimensional memory apparatus and a memory system. The semiconductor device includes: a substrate including a first region and a second region, the first region being formed with a recess; a first shallow trench isolation structure and a second shallow trench isolation structure located in the first region and the second region respectively; and a first gate oxide layer on the recess and a second gate oxide layer in the second region and on the second shallow trench isolation structure.

20 Claims, 9 Drawing Sheets

SEMICONDUCTOR DEVICE WITH A SHORTER STI IN A LOW-VOLTAGE REGION THAN IN A HIGH-VOLTAGE REGION

CROSS-REFERENCE TO RELATED APPLICATIONS

This application is a continuation of International Application No. PCT/CN2021/115853, filed on Aug. 31, 2021, which is incorporated herein by reference in its entirety.

BACKGROUND

The disclosure relates to the field of semiconductor technologies, and more particularly to a semiconductor device and a method for fabricating the same, a three-dimensional (3D) memory apparatus and a memory system.

With the increasing requirement for memory density of 3D-NAND flashes, the feature size of the existing device is also continuously shrinking. On the peripheral device of a 3D-NAND flash, a high-voltage device region and a low-voltage device region are usually formed at the same time. As the feature size of the device is reduced to a certain node, serious short channel effects may occur in the field effect transistors in the existing high-voltage device region and low-voltage device region.

Moreover, since the high-voltage device region and the low-voltage device region have different requirements on breakdown voltage, it is difficult to fabricate semiconductor devices that can avoid serious short channel effect and simultaneously meet the breakdown voltage requirements of different device regions based on current processes.

Therefore, the existing technologies have disadvantages and need improvement and development

SUMMARY

Implementations of semiconductor devices and methods for fabricating the same, which can effectively avoid serious short channel effect in the semiconductor device and simultaneously meet the requirements of breakdown voltages of different device regions in the semiconductor device, are disclosed herein.

In one aspect, a method for fabricating a semiconductor device is disclosed. A substrate including a first region and a second region is provided. A recess is formed in the first region. A first oxide layer is formed in the first region and a second oxide layer is formed in the second region to form a first gate oxide layer on the recess. A first mask layer is formed on the first oxide layer and the second oxide layer. A first shallow trench isolation structure is formed in the first region and a second shallow trench isolation structure is formed in the second region. A height of the first shallow trench isolation structure in a first direction is larger than a height of the second shallow trench isolation structure in the first direction. The first mask layer is removed. A second gate oxide layer is formed on the second shallow trench isolation structure.

In some implementations, the substrate further includes a third region, the recess is formed in the first region and a slicing groove in the third region.

In some implementations, the isolation trenches are formed in the first region and the second region in the substrate; an isolation material is filled in the isolation trenches to form the first shallow trench isolation structure in the first region; and a portion of the isolation material filled in the second region is removed to form the second shallow trench isolation structure.

In some implementations, the second oxide layer is removed; and the second gate oxide layer is formed on a surface of the substrate and on sidewalls of the isolation trenches in the second region.

In some implementations, a thickness of the first gate oxide layer is larger than a thickness of the second gate oxide layer.

In some implementations, a first gate layer is formed on the first gate oxide layer; and a second gate layer is formed on the second gate oxide layer.

In some implementations, a thermal oxidation operation is performed to form the second gate oxide layer on sidewalls of the isolation trenches in the second region and on the substrate in the second region.

In a further aspect, a semiconductor device is disclosed. The semiconductor device includes a substrate including a first region and a second region, the first region being formed with a recess; a first shallow trench isolation structure in the first region and a second shallow trench isolation structure in the second region, a height of the first shallow trench isolation structure in a first direction being larger than a height of the second shallow trench isolation structure in the first direction; and a first gate oxide layer on the recess and a second gate oxide layer on the second shallow trench isolation structure.

In some implementations, the substrate further includes a third region comprising a slicing groove.

In some implementations, the semiconductor device further includes a first gate layer on the first gate oxide layer; and a second gate layer on the second gate oxide layer.

In some implementations, a thickness of the first gate oxide layer is greater than a thickness of the second gate oxide layer.

In some implementations, a thickness of the first gate layer above the recess is less than a thickness of the second gate layer above the second shallow trench isolation structure.

In some implementations, the semiconductor device further includes a third shallow trench isolation structure in the second region adjacent to the second shallow trench isolation structure; and a channel disposed between the second shallow trench isolation structure and the third shallow trench isolation structure. The second gate layer is formed on the second shallow trench isolation structure and the third shallow trench isolation structure, and the second gate layer surrounds the channel from three sides of the channel.

In still a further aspect, a semiconductor device is disclosed. The semiconductor device includes a substrate including a first region and a second region; a plurality of first shallow trench isolation structures in the first region and a plurality of second shallow trench isolation structures in the second region, a height of the first shallow trench isolation structure in a first direction being larger than a height of the second shallow trench isolation structure in the first direction; a first gate layer in the first region between adjacent first shallow trench isolation structures; and a second gate layer in the second region above adjacent second shallow trench isolation structures. The second gate layer surrounds a channel from three sides of the channel.

In some implementations, the channel is a fin-like structure.

In some implementations, a thickness of the first gate layer above the recess is less than a thickness of the second gate layer above the second shallow trench isolation structure.

In some implementations, the semiconductor device further includes a recess on the substrate in the first region; a first gate oxide layer on the recess between the substrate and the first gate layer; and a second gate oxide layer between the second gate layer and the channel.

In some implementations, a thickness of the first gate oxide layer is greater than a thickness of the second gate oxide layer.

In some implementations, the second gate oxide layer surrounds the channel from three sides of the channel.

In some implementations, the substrate further comprises a third region comprising a slicing groove.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

DETAILED DESCRIPTION

Figure 1:
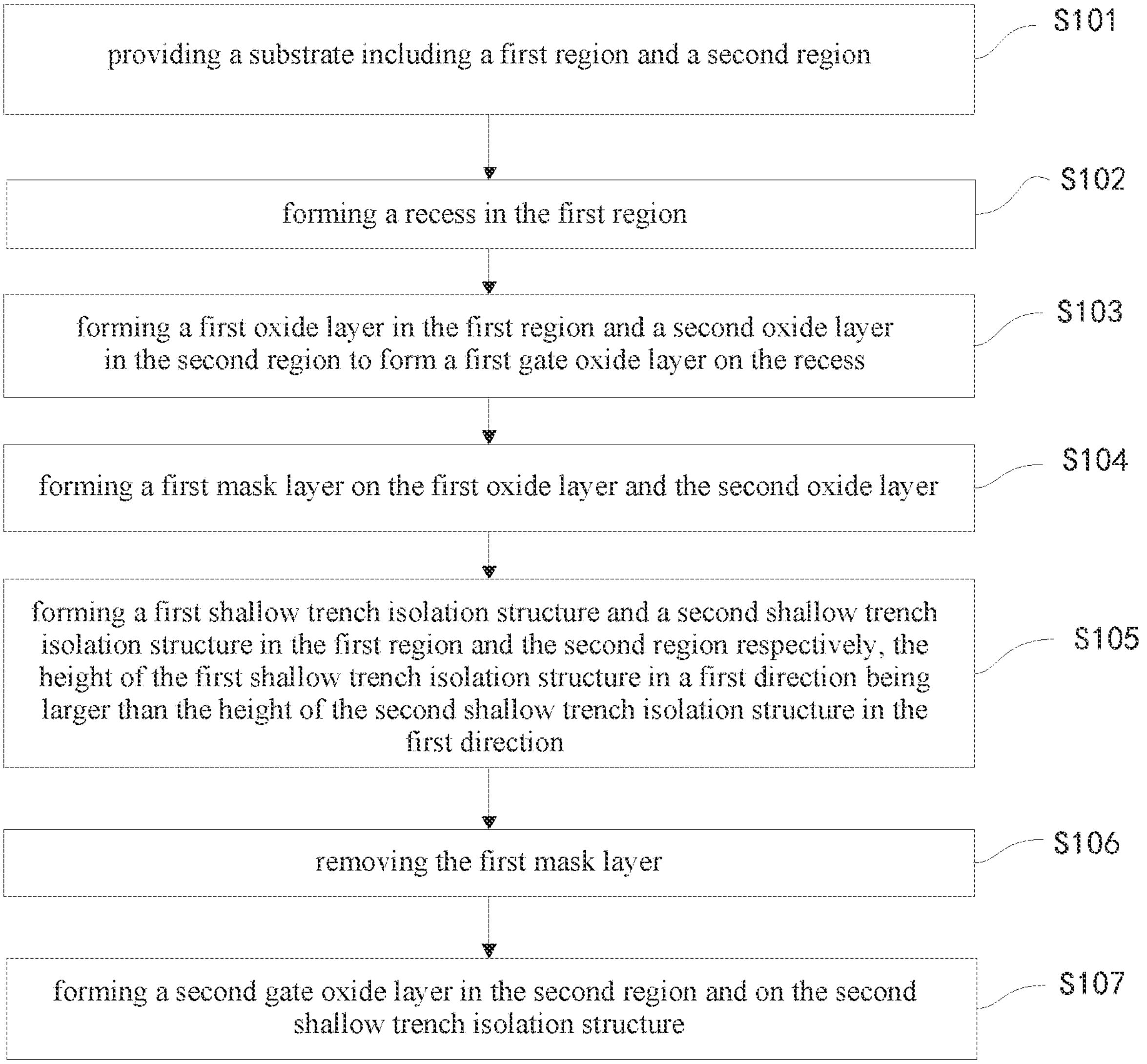
FIG. 1 illustrates a flowchart of a method for fabricating an exemplary semiconductor device, according to some aspects of the present disclosure.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

FIG. 1 illustrates a flowchart of a method for fabricating an exemplary semiconductor device, according to some aspects of the present disclosure. As shown in FIG. 1, the fabrication method includes the specific process flow as follows.

Figure 4A:
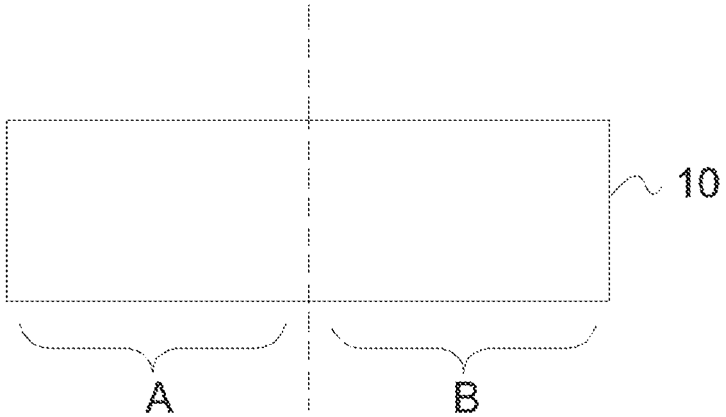
FIG. 4A-4M illustrate cross-sectional diagrams of an exemplary semiconductor device, in various stages, according to some aspects of the present disclosure.

In step S101, a substrate is provided, the substrate including a first region and a second region, and the cross-sectional diagram after the completion of step S101 is shown in FIG. 4A.

Specifically, the substrate 10 may be made of a semiconductor material such as silicon, germanium, or silicon-on-insulator (SOI), etc. In some implementations, the substrate 10 may include a first region (A region) and a second region (B region). In some implementations, the A region is a high-voltage device region and is used to form recess gate transistors in a later operation; and the B region is a low-voltage device region and may further include a low-low-voltage device region having a breakdown voltage lower than that of the low-voltage device region. In some implementations, the B region is used to form fin-like transistors similar to fin transistors (FinFET). In a fin-like transistor, the gate may surround the channel from three sides, so that the control area of the gate to channel is increased and thus the ability of gate control is greatly enhanced. As a result, the short channel effects can be inhibited effectively, and the sub-threshold leakage current can be reduced. Since the high-voltage device region requires a relatively high breakdown voltage, the source-drain junction depth of the device is required to be deeper, and the height of the corresponding "Fin" (Fin structure) of the fin-like transistor is also higher. The existing process is difficult to form a gate structure surrounded on three sides on the higher Fin, so that the region A does not adopt the fin-like transistor.

Figure 4B:
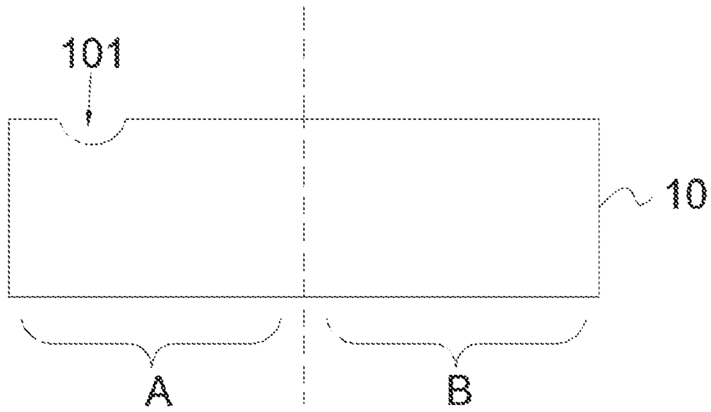

In step S102, a recess is formed in the first region, and the cross-sectional diagram of the semiconductor device after the completion of step S102 is shown in FIG. 4B.

In some implementations, the recess 101 facilitates the subsequent formation of a gate with a relatively larger channel length in the first region so as to alleviate short channel effects in the first region. In some implementations, the recess 101 may be formed by etching the substrate 10 through plasma etching process, reactive ion etching process and/or wet etching process. In some implementations, the recess 101 may be formed in region A through plasma etching process, and the specific process can be carried out for etching through mixing Cl2, BCl3, He and CF4 gas according to a certain proportion.

Figure 4C:
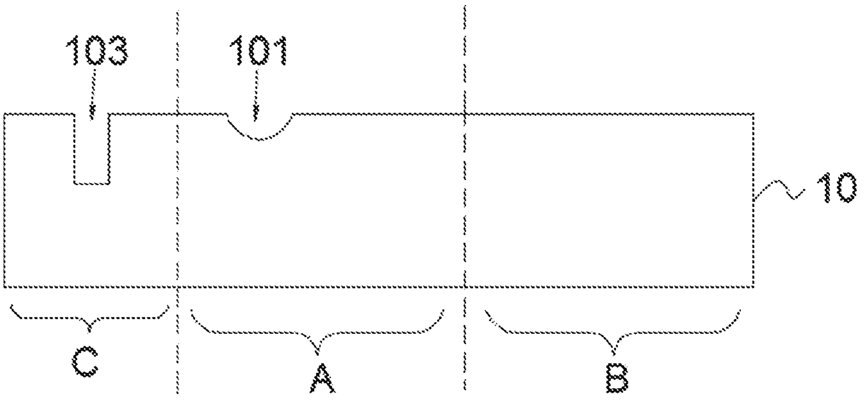

In some implementations, the substrate 10 further includes a third region (C region), which is used for isolation when the semiconductor device is cut off from the wafer and additionally for process monitoring. For example, test patterns may be formed in the third region to monitor variation of a process (e.g., photolithography process) in real time. In some implementations, step S102 may include forming the recess and a slicing groove in the first region and the third region respectively. The structural diagram corresponding to the completion of this step is shown in FIG. 4C.

In some implementations, a slicing groove is generally formed through laser etching and thus may be formed separately from the recess 101. In some implementations, the recess 101 and the slicing groove 103 may be simultaneously formed on the substrate 10 by designing a mask having the patterns of the recess 101 and the slicing groove 103 and then performing the photolithography and etching processes, so that the process steps are saved, and the process cost is advantageously saved accordingly.

Figure 4D:
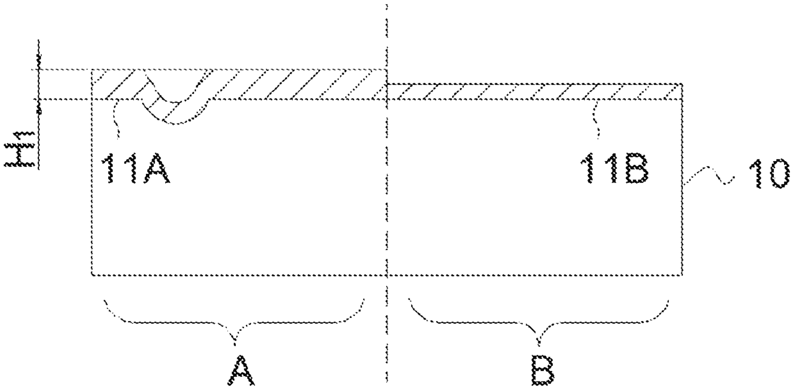

In step S103, a first oxide layer is formed in the first region and a second oxide layer is formed in the second region to form a first gate oxide layer on the recess, and the cross-sectional diagram of the semiconductor device after the completion of step S103 is shown in FIG. 4D.

In some implementations, the forming process of the first oxide layer 11A and the second oxide layer 11B may include thermal oxidation process, soft plasma oxidation process or UV photo assistant oxidation process, and when the substrate 10 is selected to be a silicon substrate, the first oxide layer 11A and the second oxide layer 11B are both silicon oxide. In some implementations, the first oxide layer 11A is used as the first gate oxide layer of the A region.

Figure 4E:
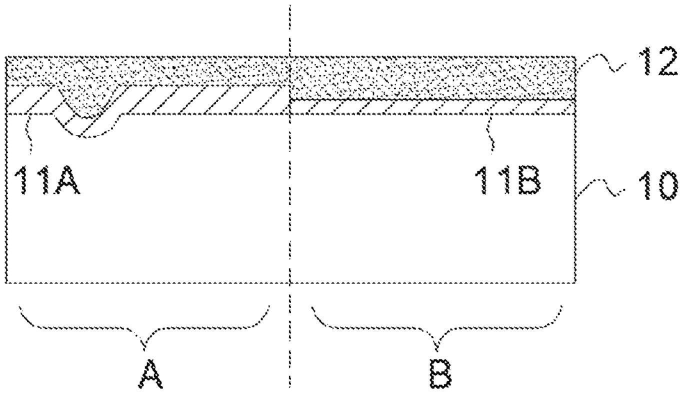

In step S104, a first mask layer is formed on the first oxide layer and the second oxide layer, and the structural diagram after the completion of step S104 is shown in FIG. 4E.

In some implementations, the first mask layer 12 is a hard mask layer and the specific material may be selected from silicon nitride. The first oxide layer 11A and the second oxide layer 11B are advantageous for reducing stress on the substrate 10 caused by the formation of the silicon nitride layer. In some implementations, the silicon nitride layer may be formed by Low Pressure Chemical Vapor Deposition (LPCVD) process.

In step S105, a first shallow trench isolation structure and a second shallow trench isolation structure are formed in the first region and in the second region respectively. In some implementations, the height of the first shallow trench isolation structure in the first direction may be larger than the height of the second shallow trench isolation structure in the first direction.

Figure 2:
FIG. 2 illustrates a flowchart of a method for fabricating another exemplary semiconductor device, according to some aspects of the present disclosure.

FIG. 2 illustrates a flowchart of a method for fabricating another exemplary semiconductor device, according to some aspects of the present disclosure. As shown in FIG. 2, step S105 may include the following steps.

Figure 4F:
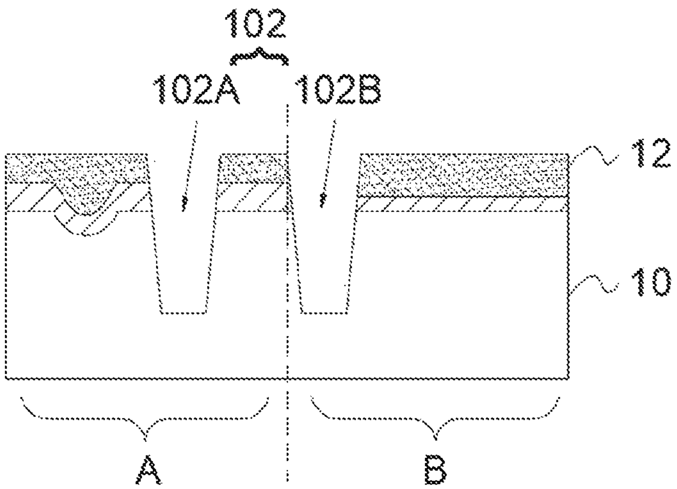

In step S1051, the substrate is etched to form an isolation trench in the substrate, and the cross-sectional diagram of the semiconductor device after the completion of step S1051 is shown in FIG. 4F.

Figure 4G:
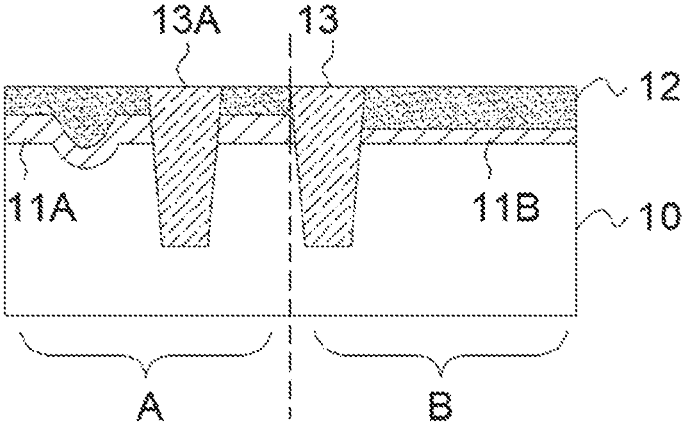

In step S1052, an isolation material is filled in the isolation trench to form the first shallow trench isolation structure in the first region, and the cross-sectional diagram of the semiconductor device after the completion of step S1052 is shown in FIG. 4G.

Figure 4H:
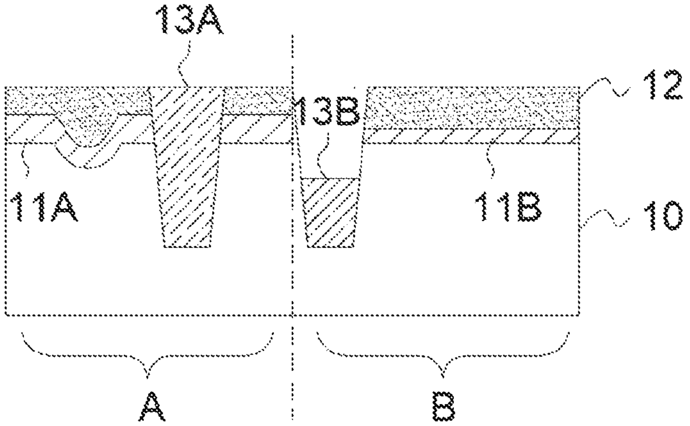

In step S1053, the isolation material distributed in the second region is etched to form the second shallow trench isolation structure, and the cross-sectional diagram of the semiconductor device after the completion of step S1053 is shown in FIG. 4H.

In some implementations, a photoresist pattern defining the position of the isolation trench 102 and having an opening may be formed by coating photoresist (not shown) on the surface of the first mask layer 12 and performing photolithography processes such as exposure and development. Then, the first mask layer 12, the first oxide layer 11A, and the second oxide layer 11B may be etched through the opening by using reactive ion etching (RIE) or plasma etching process to expose the surface of the substrate 10. In some implementations, the substrate 10 may be etched by using a fluorine-containing etching gas and using the first mask layer 12 as a mask, so that the isolation trench 102 is formed in the substrate 10. In some implementations, the isolation trench 102 includes a first sub-isolation trench 102A and a second sub-isolation trench 102B, and the first sub-isolation trench 102A and the second sub-isolation trench 102B may be formed in one step, that is, in other words, the two sub-isolation trench have the same height. Then, in some implementations, the isolation material 13 may be deposited in the isolation trench 102 and on the first mask layer 12 by a high density plasma chemical vapor deposition process, and then the isolation material 13 is planarized by a planarization process, such as a chemical mechanical polishing process, such that the isolation material 13 in the isolation trench 102 are level with the first mask layer 12. In some implementations, the isolation material 13 located in the second sub-isolation trench 102B may be selectively etched to form the second shallow trench isolation structure 13B. In some implementations, the height H1 of the first shallow trench isolation structure 13A in the first direction is greater than the height H2 of the second shallow trench isolation structure in the first direction, which is the thickness direction of the substrate 10. It should be noted that, in some implementations, the second shallow trench isolation structure 13*b* is selected to be etched lower than the substrate 10, so that the first shallow trench isolation structure 13A is higher than the substrate 10, and the substrate 10 is higher than the second shallow trench isolation structure 13B, so that the portion of the substrate 10 protruding from the second shallow trench isolation structure 13B is used as the fin structure in the fin-like field effect transistor in the region B.

Figure 4I:
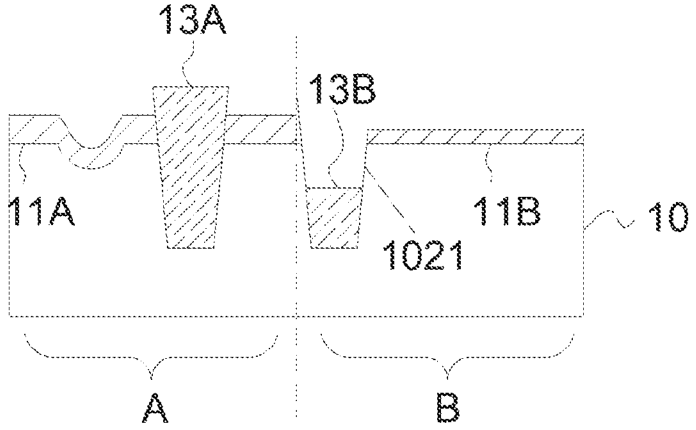

In step S106, the first mask layer is removed, and the cross-sectional diagram of the semiconductor device after the completion of step S106 is shown in FIG. 4I.

In some implementations, when the first mask layer 12 is silicon nitride material, it can be removed using hot phosphoric acid.

In step S107, a second gate oxide layer is formed in the second region and on the second shallow trench isolation structure.

With reference to FIG. 2, the step S107 may specifically include the following steps.

Figure 4J:
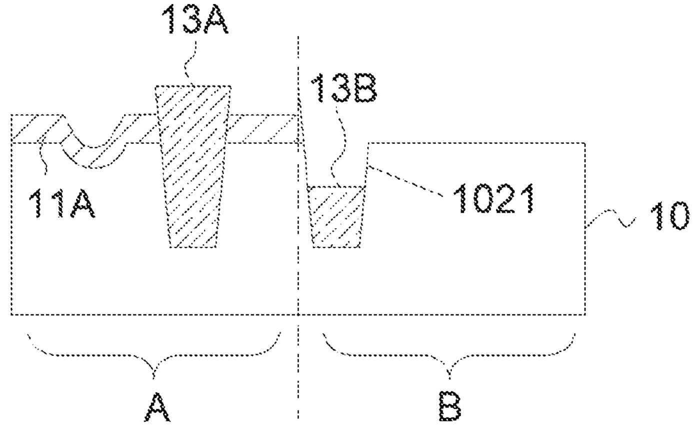

In step S1071, the second oxide layer is etched, and the cross-sectional diagram of the semiconductor device after the completion of step S1071 is shown in FIG. 4J.

Figure 4K:
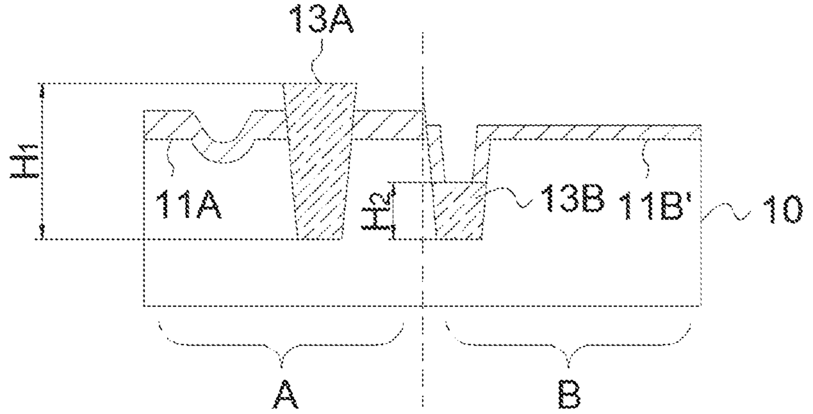

In step S1072, in the second region, the second gate oxide layer is formed on the surface of the substrate and on the sidewalls of the isolation trench, and the cross-sectional diagram of the semiconductor device after the completion of step S107 is shown in FIG. 4K.

In some implementations, since the region B is used for forming the fin-like field effect transistor, a gate oxide layer surrounding the sidewalls and the top surface of the fin-like structure needs to be formed on the corresponding fin-like structure, and due to the foregoing steps, the second oxide layer 11B is formed on the top surface of the corresponding fin-like structure. In some implementations, in order to form a gate oxide layer with uniform thickness on the corresponding fin-like structure, the second oxide layer 11B may be selectively etched first, and then a second gate oxide layer 11B' may be formed on the surface of the substrate 10 and the sidewalls 1021 of the isolation trench 102 in the second region by a thermal oxidation process. Since the second gate oxide layer 11B' is formed by an oxidation process instead of an atomic deposition process, the second gate oxide layer 11B' can completely cover the sidewalls 1021 of the isolation trench 102 and only partially cover the second shallow trench isolation structure 13B.

Figure 3:
FIG. 3 illustrates a flowchart of a method for fabricating still another exemplary semiconductor device, according to some aspects of the present disclosure.

FIG. 3 illustrates a flowchart of a method for fabricating still another exemplary semiconductor device, according to some aspects of the present disclosure. As shown in FIG. 3, after step S107, the following steps are included.

In step S108, a first gate layer is formed on the surface of the first gate oxide layer.

Figure 4L:
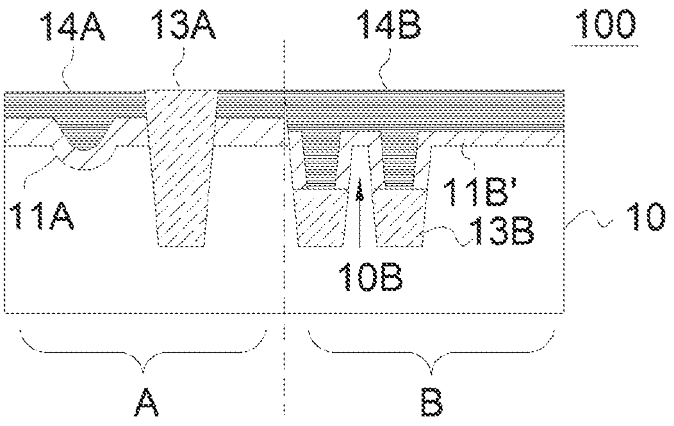
Figure 4M:
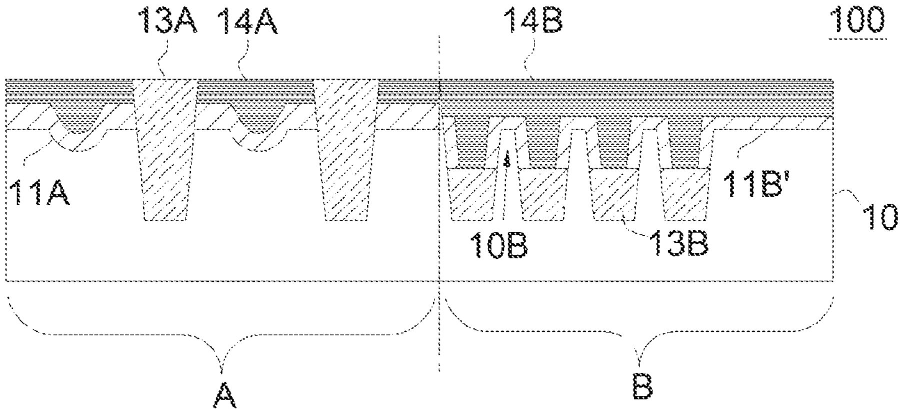

In step S109, a second gate layer is formed on the surface of the second gate oxide layer, and the cross-sectional diagrams of the semiconductor device after the completion of step S109 are shown in FIGS. 4L and 4M.

In some implementations, in FIGS. 4L and 4M, in order to better represent the structure of the second gate layer 14B, at least two adjacent trench isolation structures 13B are shown. In addition, as shown in FIG. 4M, in order to better illustrate the isolation effect of the shallow trench isolation structure 13A on the adjacent gate structures, two adjacent shallow trench isolation structures 13A are shown, and it can be seen that a plurality of shallow trench isolation structures are formed in the region A. In some implementations, the first gate layer 14A is used as a gate of a recess gate transistor after being subjected to patterning etching, and the second gate layer 14B is used as a gate of a fin-like field effect transistor after being subjected to patterning etching. The second gate layer 14B can surround a channel (e.g., the fin-like structure 10B in the figures) from three sides, so that the control area of the gate to the channel is increased, and thus the ability of gate control is greatly enhanced. As a result, the short channel effects can be inhibited effectively, and the sub-threshold leakage current can be reduced.

With reference to FIGS. 4A-4M, the disclosure also provides a semiconductor device 100 that can be fabricated by the methods described above. The semiconductor device 100 includes: a substrate 10 including a first region (A region) and a second region (B region), the first region A formed with a recess 101; a first shallow trench isolation structure 13A and a second shallow trench isolation structure 13B located in the first region and the second region respectively, the height H1 of the first shallow trench isolation structure 13A being larger than the height H2 of the second shallow trench isolation structure 13B; and a first gate oxide layer 11A on the recess 101 and a second gate oxide layer 11B' in the second region and on the second shallow trench isolation structure.

In some implementations, the substrate 10 may be made of a semiconductor material such as silicon, germanium, or silicon-on-insulator (SOI), etc. In some implementations, the substrate 10 may include a first region (A region) and a second region (B region). In some implementations, the A region is a high-voltage device region and used to form recess gate transistors in embodiments of the disclosure; and the B region is a low-voltage device region, and further, the low-voltage device region may include low-low-voltage device region having a breakdown voltage lower than that of the low-voltage device region. The B region is used to form fin-like field effect transistor in embodiments of the disclosure, and the gate may surround the channel from three sides, so that the control area of the gate to channel is increased and thus the ability of gate control is greatly enhanced. As a result, the short channel effects can be inhibited effectively, and the sub-threshold leakage current can be reduced. Since the high-voltage device region requires a relatively high breakdown voltage, the source-drain junction depth of the device is required to be deeper, and the height of the corresponding fin-like structure is also higher. The existing process is difficult to form a gate structure surrounded on three sides on the higher fin-like structure, so that the region A does not adopt the FinFET. The recess 101 facilitates the subsequent formation of a gate with a relatively larger channel length in the first region so as to alleviate short channel effects in the first region.

In some implementations, the substrate 10 may further include a third region (C region) that formed with a slicing groove 103.

The third region (C region) may be used for isolation when the semiconductor device is cut off from the wafer and additionally for process monitoring. For example, test patterns may be formed in the third region to monitor variation of a process (e.g., photolithography process) in real time. Specifically, in existing processes, a slicing groove is generally formed through laser etching and thus may be formed separately from the recess 101. In some implementations, the recess 101 and the slicing groove 103 are simultaneously formed on the substrate 10 by designing a mask having the patterns of the recess 101 and the slicing groove 103 and then performing the photolithography and etching processes, so the process steps are saved, and the process cost is advantageously saved.

In some implementations, the semiconductor device 100 may further include a first gate layer 14A on the surface of the first gate oxide layer 11A and a second gate layer 14B on the surface of the second gate oxide layer 11B'.

In some implementations, in FIGS. 4L and 4M, in order to better represent the structure of the second gate layer 14B, at least two adjacent trench isolation structures 13B are shown. In addition, in some implementations, as shown in FIG. 4M, in order to better illustrate the isolation effect of the shallow trench isolation structure 13A on the adjacent gate structures, two adjacent shallow trench isolation structures 13A are shown, and it can be seen that a plurality of shallow trench isolation structures are formed in the region A. In some implementations, the first gate layer 14A is used as a gate of a recess gate transistor after being subjected to patterning etching, and the second gate layer 14B is used as a gate of a fin-like field effect transistor after being subjected to patterning etching. The second gate layer 14B can surround a channel (e.g., the fin-like structure 10B in the figures) from three sides, so that the control area of the gate to the channel is increased, and thus the ability of gate control is greatly enhanced. As a result, the short channel effects can be inhibited effectively, and the sub-threshold leakage current can be reduced.

Figure 5:
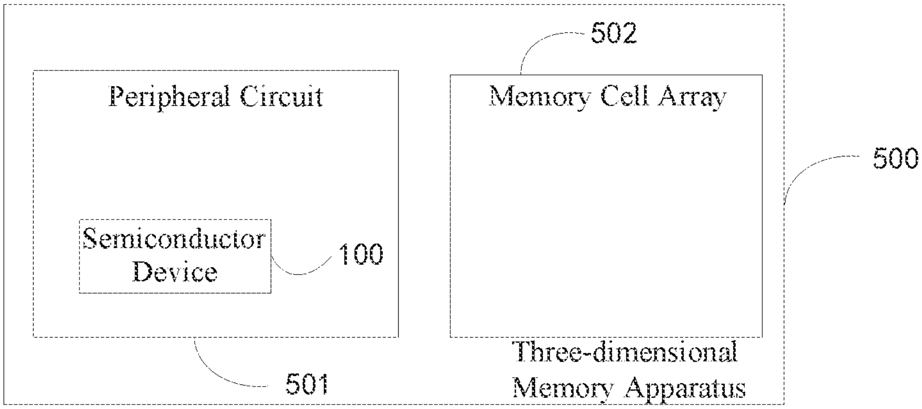
FIG. 5 illustrates a structural diagram of an exemplary three-dimensional memory apparatus, according to some aspects of the present disclosure.

FIG. 5 illustrates a structural diagram of an exemplary three-dimensional memory apparatus, according to some aspects of the present disclosure. The three-dimensional memory apparatus 500 may include a memory cell array 502 and peripheral circuits 501 including the above-described semiconductor device 100. In some implementations, the three-dimensional memory apparatus 500 may be an NAND chip.

Figure 6:
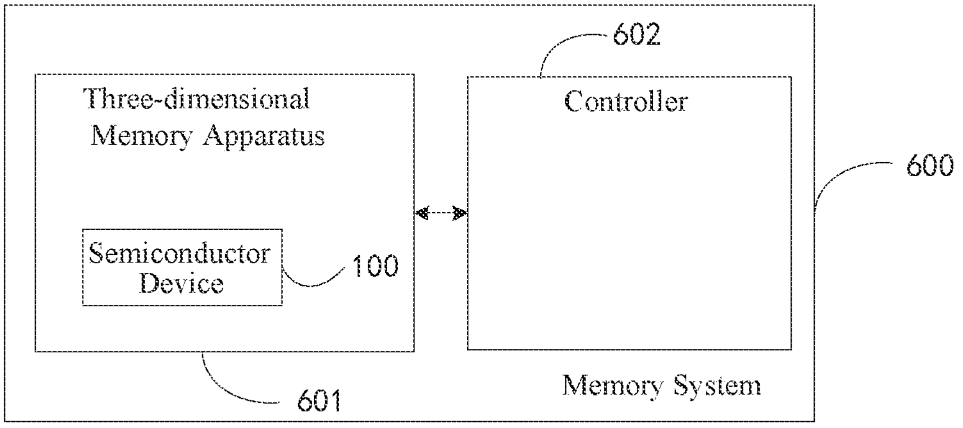
FIG. 6 illustrates a structural diagram of an exemplary memory system, according to some aspects of the present disclosure.

FIG. 6 illustrates a structural diagram of an exemplary memory system, according to some aspects of the present disclosure. The memory system 600 may include a controller 602 and a three-dimensional memory apparatus 601. The controller 602 is coupled to the three-dimensional memory apparatus 601 and used to control the three-dimensional memory apparatus 601 to store data. The three-dimensional memory apparatus 601 may include the above-described semiconductor device 100. In some implementations, the memory system 600 may be a solid-state drive (SSD).

For the semiconductor device and the method for fabricating the same provided in the disclosure, in one aspect, a recess is formed in the first region and a first gate oxide layer is formed on the recess, which is beneficial to forming a gate with a larger channel length in the first region so as to alleviate short the channel effects of the first region; and in another aspect, a second shallow trench isolation structure is formed in the second region so that the height of the first shallow trench isolation structure is larger than that of the second shallow trench isolation structure, and a second gate oxide layer is formed on the second shallow trench isolation structure, which is beneficial to forming fin-like field effect transistors in the second region, so as to alleviate the short channel effects in the second region as well.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
- a substrate comprising a first region and a second region, the first region being formed with a first recess;
- a first shallow trench isolation structure in the first region and a second shallow trench isolation structure in the second region, a height of the first shallow trench isolation structure in a first direction being larger than a height of the second shallow trench isolation structure in the first direction;
- a first gate oxide layer on the first recess and a second gate oxide layer on the second shallow trench isolation structure, wherein the first gate oxide layer comprises a second recess located at a side away from the substrate in the first direction; and
- a first gate layer on the second recess,
- wherein a first top surface of the first shallow trench isolation structure is higher than a second top surface of the first gate oxide layer in the first direction;
- wherein the first region is a high-voltage device region, and the second region is a low-voltage device region; and
- wherein the first recess and the first shallow trench isolation structure are formed at different locations in the first region.

2. The semiconductor device of claim 1, wherein the substrate further comprises a third region comprising a slicing groove.

3. The semiconductor device of claim 1, further comprising:
- a second gate layer on the second gate oxide layer.

4. The semiconductor device of claim 3, wherein a thickness of the first gate layer above the second recess is less than a thickness of the second gate layer above the second shallow trench isolation structure.

5. The semiconductor device of claim 3, further comprising:
- a third shallow trench isolation structure in the second region adjacent to the second shallow trench isolation structure; and
- a channel disposed between the second shallow trench isolation structure and the third shallow trench isolation structure,
- wherein the second gate layer is formed on the second shallow trench isolation structure and the third shallow trench isolation structure, and the second gate layer surrounds the channel from three sides of the channel.

6. The semiconductor device of claim 3, wherein the first top surface of the first shallow trench isolation structure is coplanar to a third top surface of the first gate layer.

7. The semiconductor device of claim 1, wherein a thickness of the first gate oxide layer is greater than a thickness of the second gate oxide layer.

8. The semiconductor device of claim 1, wherein the first shallow trench isolation structure penetrates the first gate oxide layer.

9. The semiconductor device of claim 1, wherein the first gate oxide layer comprises a concave structure.

10. The semiconductor device of claim 1, wherein the first gate oxide layer is in direct contact with a sidewall of the first shallow trench isolation structure.

11. A semiconductor device, comprising:
- a substrate comprising a first region and a second region;
- a first recess on the substrate in the first region;
- a plurality of first shallow trench isolation structures in the first region and a plurality of second shallow trench isolation structures in the second region, a height of the first shallow trench isolation structure in a first direction being larger than a height of the second shallow trench isolation structure in the first direction;
- a first gate oxide layer on the first recess, wherein the first gate oxide layer comprises a second recess located at a side away from the substrate in the first direction;
- a first gate layer in the first region on the second recess and between adjacent first shallow trench isolation structures; and
- a second gate layer in the second region above adjacent second shallow trench isolation structures,
- wherein the second gate layer surrounds a channel from three sides of the channel;

wherein a first top surface of the first shallow trench isolation structure is coplanar to a second top surface of the first gate layer;

wherein the first region is a high-voltage device region, and the second region is a low-voltage device region; and wherein the first recess and the first shallow trench isolation structure are formed at different locations in the first region.

12. The semiconductor device of claim 11, wherein the channel is a fin-like structure.

13. The semiconductor device of claim 11, further comprising:

a second gate oxide layer between the second gate layer and the channel.

14. The semiconductor device of claim 13, wherein a thickness of the first gate layer above the second recess is less than a thickness of the second gate layer above the second shallow trench isolation structure.

15. The semiconductor device of claim 14, wherein a thickness of the first gate oxide layer is greater than a thickness of the second gate oxide layer.

16. The semiconductor device of claim 14, wherein the second gate oxide layer surrounds the channel from three sides of the channel.

17. The semiconductor device of claim 13, wherein the first top surface of the first shallow trench isolation structure is higher than a third top surface of the first gate oxide layer in the first direction.

18. The semiconductor device of claim 13, wherein the first shallow trench isolation structure penetrates the first gate oxide layer.

19. The semiconductor device of claim 11, wherein the substrate further comprises a third region comprising a slicing groove.

20. The semiconductor device of claim 11, wherein the first gate oxide layer comprises a concave structure.

* * * * *